US011777538B2

(12) United States Patent
Tam et al.

(10) Patent No.: US 11,777,538 B2
(45) Date of Patent: Oct. 3, 2023

(54) DIFFERENTIAL OUTPUT CIRCUITS WITH CONFIGURABLE HARMONIC REDUCTION CIRCUITS AND METHODS OF OPERATION THEREOF

(71) Applicant: NXP USA, Inc., Austin, TX (US)

(72) Inventors: Sai-Wang Tam, Sunnyvale, CA (US); Xiao Xiao, Sunnyvale, CA (US); Alden C Wong, Sunnyvale, CA (US); Ovidiu Carnu, Scotts Valley, CA (US)

(73) Assignee: NXP USA, Inc., Austin, TX (US)

( * ) Notice: Subject to any disclaimer, the term of this patent is extended or adjusted under 35 U.S.C. 154(b) by 9 days.

(21) Appl. No.: 17/649,332

(22) Filed: Jan. 28, 2022

(65) Prior Publication Data
US 2023/0246658 A1 Aug. 3, 2023

(51) Int. Cl.
*H04B 1/04* (2006.01)
*H03F 3/45* (2006.01)
*H04B 17/13* (2015.01)

(52) U.S. Cl.
CPC ........... *H04B 1/04* (2013.01); *H03F 3/45475* (2013.01); *H04B 17/13* (2015.01);
(Continued)

(58) Field of Classification Search
CPC ..... H03F 3/24; H03F 3/45; H03F 3/72; H03F 3/191; H03F 3/45475; H03F 2200/06;
(Continued)

(56) References Cited

U.S. PATENT DOCUMENTS 10,581,478 B1 * 3/2020 Tam ..................... H04B 1/0458
11,533,075 B1 * 12/2022 Yu .......................... H03F 3/245
(Continued)

OTHER PUBLICATIONS

Y. Liu et al., "13.2 A 3.7mW-RX 4.4mW-TX fully integrated Bluetooth Low-Energy/IEEE802.15.4/proprietary SoC with an ADPLL-based fast frequency offset compensation in 40nm CMOS," 2015 IEEE International Solid-State Circuits Conference—(ISSCC) Digest of Technical Papers, San Francisco, CA, Feb. 2015, pp. 1-3.
(Continued)

*Primary Examiner* — Shawkat M Ali

(57) ABSTRACT

An electronic circuit includes a differential output circuit that produces a differential output signal at a differential output. A primary winding of a balun has a first balun terminal coupled to a first differential output terminal, and a second balun terminal coupled to a second differential output terminal. A configurable harmonic reduction circuit includes first and second configurable shunt capacitance circuits coupled between the first differential output terminal or the second differential output terminal, respectively, and a ground reference node. A control circuit receives tuning data associated with a calibrated tuning state. The tuning data indicates a first and second calibrated capacitance values, which are unequal, for the first and second configurable shunt capacitance circuits, respectively. The control circuit controls the first configurable shunt capacitance circuit to have the first calibrated capacitance value, and controls the second configurable shunt capacitance circuit to have the second calibrated capacitance value.

18 Claims, 5 Drawing Sheets

(52) U.S. Cl.
CPC .... *H03F 2200/06* (2013.01); *H03F 2200/451* (2013.01); *H04B 2001/045* (2013.01)

(58) Field of Classification Search
CPC ....... H03F 2200/451; H04B 1/04; H04B 1/18; H04B 1/40; H04B 7/00; H04B 17/13; H04B 2001/045
USPC ................... 330/51, 254; 333/132; 375/219, 375/295–297
See application file for complete search history.

(56) References Cited

U.S. PATENT DOCUMENTS

| | | | |
|---|---|---|---|
| 2009/0091384 A1* | 4/2009 | Sorrells | H03F 3/211 330/207 R |
| 2019/0006995 A1* | 1/2019 | Jurkov | H03F 1/565 |
| 2020/0091955 A1 | 3/2020 | Wang et al. | |

OTHER PUBLICATIONS

T. Wang et al., "An 113DB-Link-Budget Bluetooth-5 SoC with an 8dBm 22%-Efficiency TX," 2018 IEEE Symposium on VLSI Circuits, Honolulu, HI, Jun. 2018, pp. 25-26.

N. Kim et al., "A 1.04-4V, Digital-Intensive Dual-Mode BLE 5.0/IEEE 802.15.4 Transceiver SoC with extended range in 28nm CMOS," 2019 IEEE Radio Frequency Integrated Circuits Symposium (RFIC), Boston, MA, USA, Jun. 2019, pp. 271-274.

Morteza S. Alavi: "All-Digital I/Q RF-DAC", Jun. 19, 2014 (Jun. 19, 2014), 193 pages—uploaded in 2 parts.

* cited by examiner

| | TUNING STATE | CIRCUIT 141/241 CAPACITACE VALUE | CIRCUIT 141/241 CONTROL WORD | CIRCUIT 141/246 CAPACITACE VALUE | CIRCUIT 141/246 CONTROL WORD | MEASURED DUTY CYCLE |
|---|---|---|---|---|---|---|
| 621 → | 1 | 15 x C | 1111 | 0 x C | 0000 | 40.2 |
| 622 → | 2 | 14 x C | 1110 | 1 x C | 0001 | 41.3 |
| | 3 | 13 x C | 1101 | 2 x C | 0010 | 42.5 |
| | 4 | 12 x C | 1100 | 3 x C | 0011 | 43.6 |
| | 5 | 11 x C | 1011 | 4 x C | 0100 | 44.7 |
| | 6 | 10 x C | 1010 | 5 x C | 0101 | 45.7 |
| 627 → | 7 | 9 x C | 1001 | 6 x C | 0110 | 46.4 |
| | 8 | 8 x C | 1000 | 7 x C | 0111 | 47.2 |
| | 9 | 7 x C | 0111 | 8 x C | 1000 | 47.9 |
| | 10 | 6 x C | 0110 | 9 x C | 1001 | 48.5 |
| | 11 | 5 x C | 0101 | 10 x C | 1010 | 49.1 |
| | 12 | 4 x C | 0100 | 11 x C | 1011 | 49.6 |
| 633 → | 13 | 3 x C | 0011 | 12 x C | 1100 | 50.1 |
| | 14 | 2 x C | 0010 | 13 x C | 1101 | 50.8 |
| | 15 | 1 x C | 0001 | 14 x C | 1110 | 51.6 |
| 636 → | 16 | 0 x C | 0000 | 15 x C | 1111 | 52.4 |

_US 11,777,538 B2_

DIFFERENTIAL OUTPUT CIRCUITS WITH CONFIGURABLE HARMONIC REDUCTION CIRCUITS AND METHODS OF OPERATION THEREOF

TECHNICAL FIELD OF THE INVENTION

The present invention relates generally to harmonic reduction in circuits with a differential output, such as a power amplifier.

BACKGROUND OF THE INVENTION

Various types of circuits produce differential output signals centered around a fundamental frequency of operation. In some cases, the differential output signals may include significant signal energy at one or more harmonics of the fundamental frequency. For example, power amplifiers with differential outputs are commonly used in wireless transmitters and transceivers to amplify radio frequency signals that are to be transmitted over the air interface. In some cases, a power amplifier with a differential output may produce amplified signals with relatively strong signal components at the second harmonic of the fundamental frequency of operation of the amplifier. If not appropriately mitigated, this second harmonic energy may be emitted (e.g., radiated) into the air by conductive circuit elements (e.g., routing traces and/or an antenna), and the emitted second harmonic energy may, in some cases, exceed maximum allowable levels specified by governmental regulation agencies (e.g., the Federal Communications Commission (FCC)). Accordingly, developers of amplifiers and other circuitry with differential outputs strive to develop circuitry that complies, during operation, with harmonic emission regulations.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Embodiments of the inventive subject matter include a differential output circuit (e.g., an amplifier of a transmitter), which produces a differential output signal at a differential output. The differential output includes first and second differential output terminals. A primary winding of a balun has a first balun terminal coupled to the first differential output terminal, and a second balun terminal coupled to the second differential output terminal. A configurable harmonic reduction circuit includes first and second configurable shunt capacitance circuits coupled between the first differential output terminal or the second differential output terminal, respectively, and a ground reference node.

A calibration process is performed, according to various embodiments, to identify a calibrated tuning state at which second harmonic signal energy is minimized. During normal operations, a control circuit receives tuning data associated with the calibrated tuning state. The tuning data indicates a first and second calibrated capacitance values, which are unequal, for the first and second configurable shunt capacitance circuits, respectively. Prior to normal operations, the control circuit controls the first configurable shunt capacitance circuit to have the first calibrated capacitance value, and controls the second configurable shunt capacitance circuit to have the second calibrated capacitance value.

Figure 1:
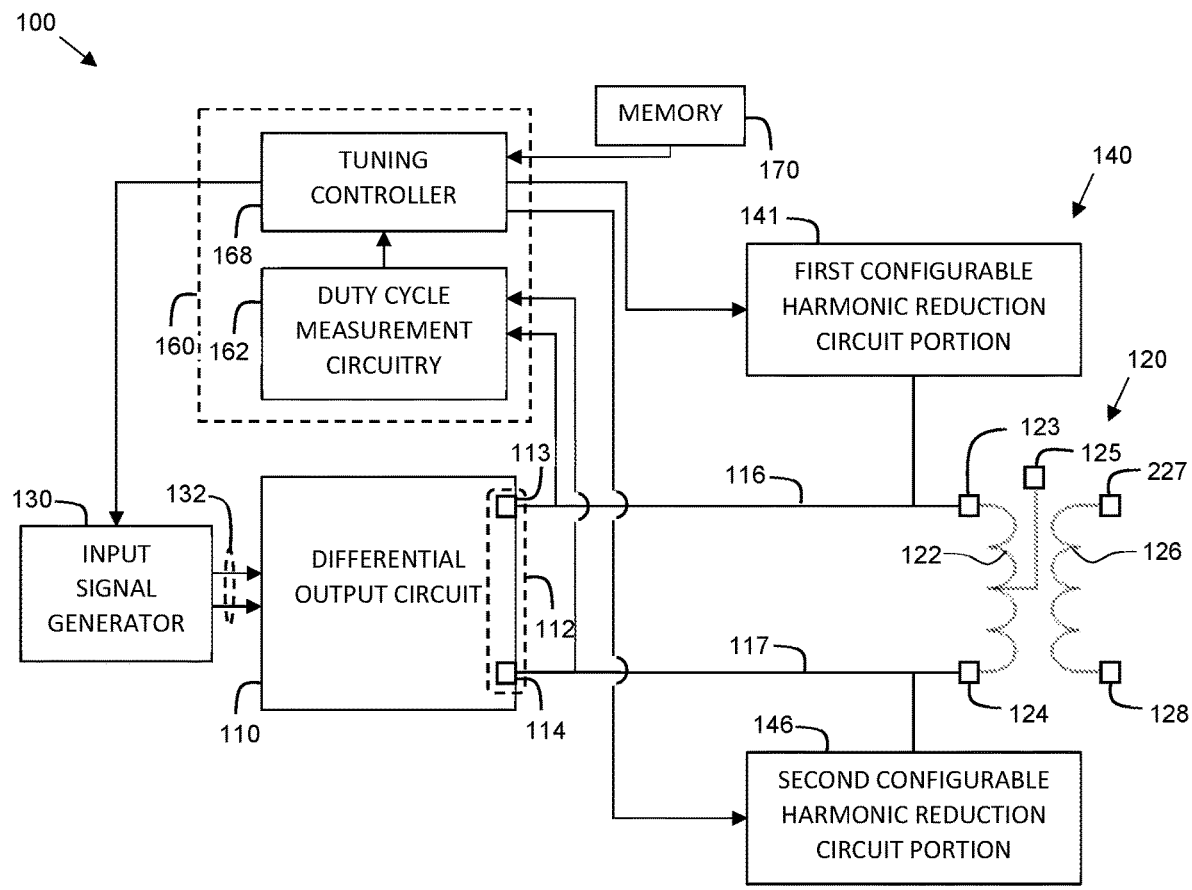
FIG. 1 is a simplified circuit diagram illustrating an electronic system that includes a differential output circuit and a configurable harmonic reduction circuit, according to an embodiment.

FIG. 1 is a simplified circuit diagram illustrating an electronic system 100 that includes a configurable harmonic reduction circuit 140 coupled between a differential output circuit 110 and a balun 120, according to an embodiment. In addition, electronic system 100 includes an input signal generator 130, a calibration and tuning subsystem 160 (referred to more generally as a "control circuit"), and memory 170, according to an embodiment.

In some embodiments, all of the components of the electronic system 100 may be integrally-formed on a single semiconductor die (e.g., within a single integrated circuit chip), such as a system on a chip (SoC). More particularly, for example, differential output circuit 110, balun 120, input signal generator 130, calibration and tuning subsystem 160, and memory 170 all may be formed on a single semiconductor die (e.g., a wireless transceiver and/or an SoC), which may also include additional processing and communications components, some of which may be electrically coupled to the electronic system 100. For example, additional components that may be integrally formed with the electronic system 100 on a single semiconductor die may include a microcontroller, microprocessor, central processing unit (CPU), additional memory (e.g., ROM, RAM, and so on), input/output ports, various peripherals, and other digital, analog, mixed-signal, and/or signal processing components. In other embodiments, some or all of the differential output circuit 110, balun 120, input signal generator 130, calibration and tuning subsystem 160, and memory 170 may be implemented as distinct devices that are not integrally formed together on a single semiconductor die.

The input signal generator 130 is configured to generate or otherwise provide a single-ended or differential input signal, which is provided over a single-ended or differential connection 132 to a corresponding single-ended or differential input of the differential output circuit 110. For example, the input signal may be an analog signal that is to be manipulated (e.g., amplified or otherwise modified) by the differential output circuit 110, in order to produce a differential analog output signal at the differential output 112. Alternatively, the input signal may be a digital signal that is processed and converted by the digital output circuit 110 into a differential analog output signal at the differential output 112. During normal operation of the electronic system 100, the input signal generator 130 may produce an information-bearing input signal. As will be described in more detail below, during a calibration process, the input signal generator 130 may produce a non-information-bearing calibration signal (e.g., a continuous wave (CW) tone).

The differential output circuit 110 may include any of a variety of circuits configured to alter the characteristics of the input signal received over connection 132, in order to produce a differential output signal at the differential output 112. As will be discussed later in conjunction with FIG. 2, for example, the differential output circuit 110 may include an amplifier (e.g., a linear or switching power amplifier) that is configured to receive a single-ended or differential input signal, and to amplify the input signal to produce an amplified differential output signal at the differential output 112. In other embodiments, the differential output circuit 110 may include a class AB power amplifier, an inverse class D power amplifier, a switch capacitor power amplifier, a Doherty power amplifier, or other circuitry that produces a differential output signal.

The differential output 112 of the differential output circuit 110 is coupled to balun 120, in an embodiment. Balun 120 includes a primary winding 122 and a secondary winding 126. According to an embodiment, the primary winding 122 has first and second balun terminals 123, 124 and a center tap 125. The first differential output terminal 113 is electrically coupled to the first balun terminal 123 through a first conductive path 116 (e.g., a first conductive routing line), and the second differential output terminal 114 is electrically coupled to the second balun terminal 124 through a second conductive path 117 (e.g., a second conductive routing line). The center tap 125 may be coupled to a voltage reference node (e.g., a bias voltage node, $V_{DD}$), in an embodiment.

The secondary winding 126 has third and fourth balun terminals 127, 128, which may be coupled to a balanced or unbalanced load. For example, as will be discussed later in conjunction with FIG. 2, one of the third or fourth balun terminals 127, 128 may be coupled to an antenna (e.g., antenna 290, FIG. 2), and the other one of the third or fourth balun terminals 127, 128 may be coupled to a ground reference node. In other words, in such an embodiment, the secondary winding 126 is coupled to a load (e.g., an antenna) with an unbalanced input (i.e., the secondary winding 126 is coupled to a single-ended or unbalanced load). In other embodiments, the secondary winding 126 may be coupled to other types of loads with unbalanced or balanced inputs.

According to an embodiment, the differential output circuit 110 is configured to produce differential output signals that are centered around a fundamental frequency of operation of the differential output circuit 110 (e.g., within a range of frequencies above and below the fundamental frequency, where the range defines the bandwidth of the differential output circuit 110). However, along with signal energy at or near the fundamental frequency, the differential output signal produced at the differential output 112 also may include undesirably strong signal energy at the second harmonic of the fundamental frequency of operation, which is outside of the band of operation. Several mechanisms may contribute to the introduction of second harmonic signal energy. For example, second harmonic signal energy may be present due to offsets resulting from physical or operational characteristics of the differential output circuit 110, physical and electrical differences between the first and second conductive paths 116, 117, and/or mismatches inherent in the input terminals 123, 124 and/or in the primary winding 122 of the balun 120, among other things.

Second harmonic signal energy may be undesirable for a number of reasons. For example, when the differential output signal produced at differential output 112 is conveyed through the first and second conductive paths 116, 117 to the balun 120, electromagnetic emissions associated with the second harmonic signal energy may be radiated into the environment. Because governmental bodies (e.g., the FCC) may regulate the strength of emissions outside of the band of operation (e.g., emissions in proximity to the second harmonic), it is generally important to ensure that any electromagnetic emissions outside the band of operation are kept below a threshold.

In order to reduce electromagnetic emissions at or near the second harmonic, electronic system 100 also includes a calibration and tuning subsystem 160 and an associated configurable harmonic reduction circuit 140. The harmonic reduction circuit 140 essentially is configured to reduce signal energy at or near the second harmonic. However, manufacturing variations associated with the mechanisms that contribute to the introduction of second harmonic signal energy may make it difficult to design a single harmonic reduction circuit that performs optimally for all manufactured instances of an electronic system (e.g., for all semiconductor chips with a given design). Accordingly, harmonic reduction circuit 140 is provided as a configurable circuit, and a calibration process is performed by the calibration and tuning subsystem 160 to configure each instance of electronic system 100 for optimal performance (e.g., maximum reduction in harmonic signal energy).

According to an embodiment, the harmonic reduction circuit 140 includes a first portion 141 coupled between the first differential output terminal 113 (or path 116 or balun terminal 123) and a ground reference node, and a second portion 146 coupled between the second differential output terminal 114 (or path 117 or balun terminal 124) and the ground reference node. Each of the first and second harmonic reduction circuit portions 141, 146 includes a configurable capacitance circuit (i.e., a capacitance circuit having a capacitance value that may be adjusted), and the calibration process is conducted to determine optimal capacitance values for the first and second harmonic reduction circuit portions 141, 146 (also referred to herein as "first and second calibrated capacitance values"). Essentially, when the first and second harmonic reduction circuit portions 141, 146 are configured to have the optimal capacitance values, the harmonic reduction circuit 140 will compensate for the above-described offsets resulting from routing/device mismatches at the input and output of the differential output circuit 110. Importantly, in most cases, the optimal capacitance values of the first and second harmonic reduction circuit portions 141, 146 may be different from each other (i.e., the calibrated capacitance values are "asymmetric"), as will be explained in more detail later. According to various embodiments, some or substantially all of the offsets will be compensated by the asymmetric capacitances established in the harmonic reduction circuit 140. Accordingly, the generation of harmonics within electronic system 100 is reduced.

As will be described in more detail below, during a calibration process (e.g., process 400, FIG. 4), a tuning controller 168 of the calibration and tuning subsystem 160 controls the input signal generator 130 to produce a calibration signal (e.g., a CW signal). The tuning controller 168 also configures the harmonic reduction circuit 140 by setting the capacitance values of each of the first and second harmonic reduction circuit portions 141, 146 to a first combination of values. According to an embodiment, control information associated with setting the capacitance values is stored in a table (e.g., table 600, FIG. 6) in memory 170.

After processing of the calibration signal by the differential output circuit 110 to produce a differential output signal at differential output 112, duty cycle measurement circuitry 162 of the calibration and tuning subsystem 160 measures the duty cycle of the differential output signal for the then-current configuration of the harmonic reduction circuit 140. The first measured duty cycle is stored, and the tuning controller 168 then re-calibrates the harmonic reduction circuit 140 by setting the capacitance values of the first and second harmonic reduction circuit portions 141, 146 to different values. The duty cycle measurement process is then repeated, and the second measured duty cycle is stored. This re-calibration and measurement process is repeated a number of times to produce a plurality of duty cycle measurements associated with a plurality of configurations of the harmonic reduction circuit 140. Ultimately, the tuning controller 168 identifies a configuration associated with a duty cycle measurement that is closest to a 50 percent duty cycle. This configuration is identified as a "calibrated tuning state," and an identification of the calibrated tuning state is stored in memory 170.

Later, to prepare for normal operation of the electronic system 100 (e.g., when the input signal generator 130 provides an information-bearing input signal to the differential output circuit 110), the tuning controller 168 retrieves, from memory 170, the control information associated with setting the capacitance values for the calibrated tuning state. The tuning controller 168 then configures the harmonic reduction circuit 140 by setting the capacitance values of each of the first and second harmonic reduction circuit portions 141, 146 to a combination of values associated with the calibrated tuning state. Normal operation of the electronic system 100 then proceeds with that configuration of the harmonic reduction circuit 140 having been established.

As mentioned previously, in one particular embodiment, the differential output circuit 110 may be an amplifier (e.g., a linear or switching power amplifier). More specifically, in some embodiments, the amplifier may form a portion of a transmitter lineup in a system that includes wireless communication capabilities (e.g., a personal area network or other wireless communication system). Such an embodiment is now discussed in detail in conjunction with FIG. 2, which is a simplified circuit diagram illustrating a portion of a transmitter 200 that includes a configurable harmonic reduction circuit 240 coupled between a differential output 212 of an amplifier 210 and a balun 220, according to another embodiment. In addition, transmitter 200 includes an input signal generator 230, a calibration and tuning subsystem 260 (referred to more generally as a "control circuit"), and memory 270, according to an embodiment.

In some embodiments, all of the components of the transmitter 200 may be integrally-formed on a single semiconductor die (e.g., within a single integrated circuit chip), such as an SoC. More particularly, for example, amplifier 210, balun 220, input signal generator 230, calibration and tuning subsystem 260, and memory 270 all may be formed on a single semiconductor die (e.g., a wireless transceiver and/or an SoC), which may also include additional processing and communications components, some of which may be electrically coupled to the transmitter 200. For example, additional components that may be integrally formed with the transmitter 200 on a single semiconductor die may include a microcontroller, microprocessor, CPU, additional memory, input/output ports, various peripherals, and other digital, analog, mixed-signal, and/or signal processing components. In other embodiments, some or all of the amplifier 210, balun 220, input signal generator 230, calibration and tuning subsystem 260, and memory 270 may be implemented as distinct devices that are not integrally formed together on a single semiconductor die.

The input signal generator 230 is configured to generate or otherwise provide a single-ended or differential analog input signal, which is provided over a single-ended or differential connection 232 to a corresponding single-ended or differential input of the amplifier 210. For example, the input signal may be an analog signal that is to be amplified by the amplifier 210, in order to produce a differential, amplified, analog output signal at the differential output 212. During normal operation of the transmitter 200, the input signal generator 230 may produce an information-bearing input signal. As will be described in more detail below, during a calibration process, the input signal generator 230 may produce a non-information-bearing calibration signal (e.g., a CW tone).

The amplifier 210 may include any of a variety of amplifiers, including a linear amplifier (e.g., a class A, class B, class AB, or class F), a switching power amplifier (e.g., a class D or class E amplifier), or another type of amplifier configured to amplify the input signal received over connection 232, in order to produce a differential, amplified output signal at the differential output 212.

The differential output 212 of the amplifier 210 is coupled to balun 220, in an embodiment. Balun 220 includes a primary winding 222 and a secondary winding 226. According to an embodiment, the primary winding 222 has first and second balun terminals 223, 224 and a center tap 225. The first differential output terminal 213 is electrically coupled to the first balun terminal 223 through a first conductive path 216 (e.g., a first conductive routing line), and the second differential output terminal 214 is electrically coupled to the second balun terminal 224 through a second conductive path 217 (e.g., a second conductive routing line). The center tap 225 may be coupled to a voltage reference node (e.g., a bias voltage node for the amplifier 210), in an embodiment.

The secondary winding 226 has third and fourth balun terminals 227, 228. According to an embodiment, the third balun terminal 227 may be coupled to an antenna 290, and the fourth balun terminal 228 may be coupled to a ground reference node 280. In other embodiments, the secondary winding 226 may be coupled to other types of loads with unbalanced or balanced inputs.

According to an embodiment, the amplifier 210 is configured to produce differential, amplified output signals that are centered around a fundamental frequency of operation of the amplifier 210 (e.g., within a range of frequencies above and below the fundamental frequency, where the range defines the bandwidth of the amplifier 210). However, as discussed above in conjunction with FIG. 1, along with signal energy at or near the fundamental frequency, the differential output signal produced at the differential output 212 also may include undesirably strong signal energy at the second harmonic, which is outside of the band of operation. Again, several mechanisms may contribute to the introduction of second harmonic signal energy. For example, second harmonic signal energy may be present due to physical or operational characteristics of the amplifier 210, physical and electrical differences between the first and second conductive paths 216, 217, and/or mismatches inherent in the input terminals 223, 224 and/or in the primary winding 222 of the balun 220, among other things.

In order to reduce electromagnetic emissions at or near the second harmonic, transmitter 200 also includes a calibration and tuning subsystem 260 and an associated configurable harmonic reduction circuit 240. The harmonic reduction circuit 240 essentially is configured to reduce signal energy generated by the transmitter 200 at or near the second harmonic. According to an embodiment, harmonic reduction circuit 240 is a configurable circuit, and a calibration process is performed by the calibration and tuning subsystem 260 to configure transmitter 200 for optimal performance (e.g., maximum reduction in harmonic signal energy).

According to an embodiment, the harmonic reduction circuit 240 includes a first portion 241 coupled between the first differential output terminal 213 (or path 216 or balun terminal 223) and a ground reference node 280, and a second portion 246 coupled between the second differential output terminal 214 (or path 217 or balun terminal 224) and the ground reference node 280. Each of the first and second harmonic reduction circuit portions 241, 246 includes a configurable capacitance circuit (i.e., a capacitance circuit having a capacitance value that may be adjusted), and the calibration process is conducted to determine optimal capacitance values for the first and second harmonic reduction circuit portions 241, 246. Essentially, when the first and second harmonic reduction circuit portions 241, 246 are configured to have the optimal capacitance values, the harmonic reduction circuit 240 will compensate for offsets resulting from routing/device mismatches at the input and output of the differential output circuit 210, as described above in conjunction with FIG. 1. Importantly, in most cases, the optimal capacitance values of the first and second harmonic reduction circuit portions 241, 246 may be different from each other (i.e., the calibrated capacitance values are "asymmetric"), as will be explained in more detail later. According to various embodiments, some or substantially all of the offsets will be compensated by the asymmetric capacitances established in the harmonic reduction circuit 240. Accordingly, the generation of harmonics within electronic system 200 is reduced. Because the first and second harmonic reduction circuit portions 241, 246 include configurable shunt capacitances, the first and second harmonic reduction circuit portions 241, 246 alternatively may be referred to as "configurable shunt capacitance circuits."

According to an embodiment, the first and second harmonic reduction circuit portions 241, 246 have identical circuit topologies. However, once each of the first and second harmonic reduction circuit portions 241, 246 are configured to have optimal capacitance values, as will be described in detail below, the capacitance values of the first and second harmonic reduction circuit portions 241, 246 may be different from each other. In other embodiments, the first and second harmonic reduction circuit portions 241, 246 may have different circuit topologies, although the overall functioning and configurability of the first and second harmonic reduction circuit portions 241, 246 are consistent with the description, below.

According to an embodiment, the first harmonic reduction circuit portion 241 includes an input 251 coupled to the first differential output terminal 213, and a number, N, of capacitance legs coupled between the input 251 and the ground reference node 280. Similarly, the second harmonic reduction circuit portion 246 includes an input 252 coupled to the second differential output terminal 214, and a number, N, of capacitance legs coupled between the input 252 and the ground reference node 280. In the embodiment illustrated in FIG. 2, each of the first and second harmonic reduction circuit portions 241, 246 includes four capacitance legs (i.e., N=4). However, in other embodiments, N may be less than four (e.g., N may be as small as two), or N may be greater than four (e.g., N may be as large as ten or more). In any event, N is greater than one.

Figure 2:
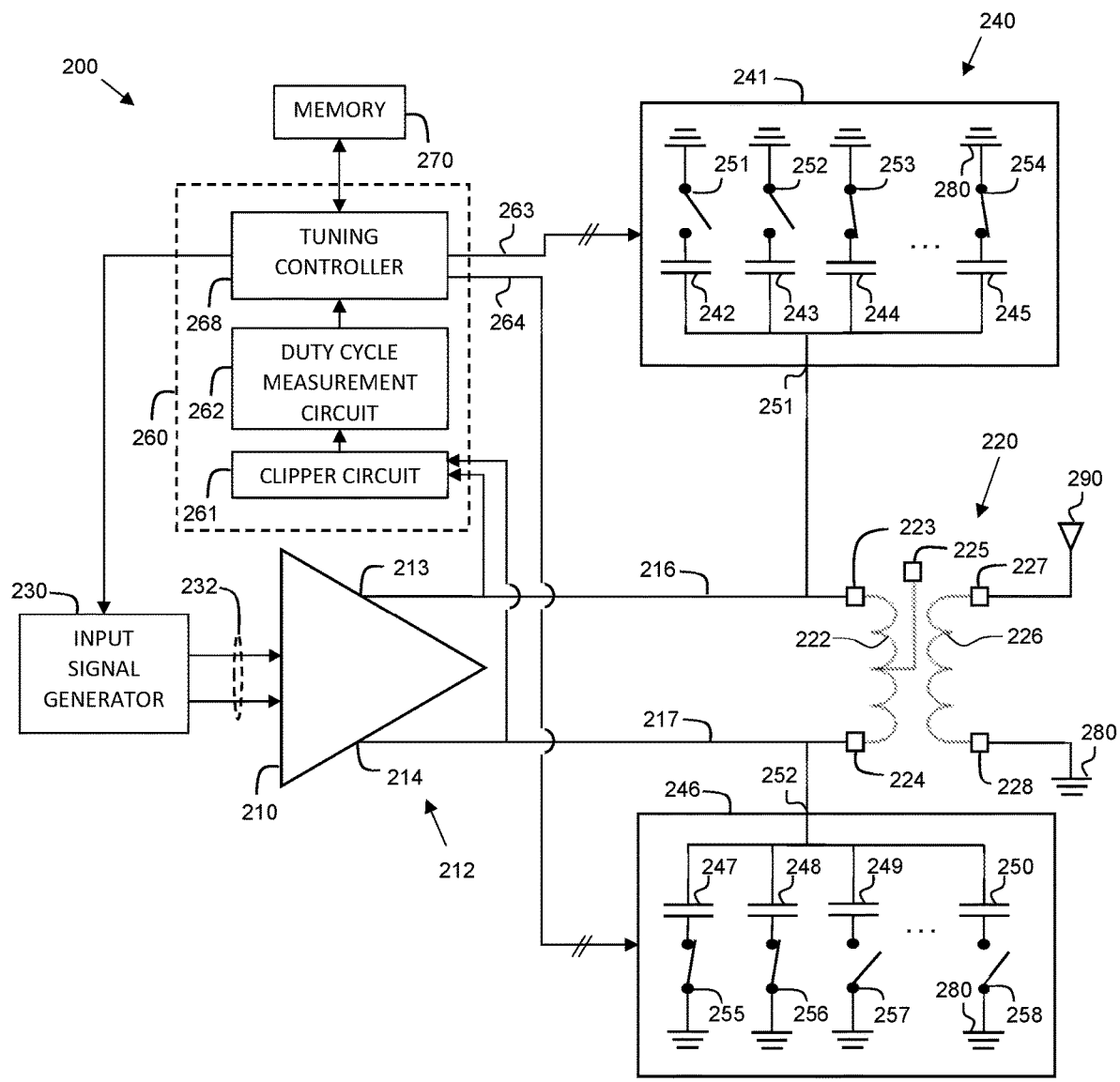
FIG. 2 is a simplified circuit diagram illustrating a portion of a transmitter that includes an amplifier with a differential output and a configurable harmonic reduction circuit, according to another embodiment.

Each of the capacitance legs in the first and second harmonic reduction circuit portions 241, 246 includes a capacitor 242, 243, 244, 245, 247, 248, 249, 250 coupled in series with a switching element 251, 252, 253, 254, 255, 256, 257, 258. For example, each capacitor 242-245, 247-250 may include a metal insulator metal (MIM) capacitor, a metal oxide semiconductor (MOS) capacitor, or another suitable type of capacitor. Each switching element 251-258 may be a field effect transistor (FET) (e.g., an insulated gate FET, a metal oxide semiconductor FET (MOS FET), a fin FET, and so on), a bipolar junction transistor (BJT), a mechanical switch, or another suitable type of switching element. As will be described in more detail below, the calibration and tuning subsystem 260 (and more specifically the tuning controller 268) is configured to control each of the first and second harmonic reduction circuit portions 241, 246 to have first and second calibrated capacitance values, respectively. More specifically, the tuning controller 268 is configured to send multi-bit (e.g., N-bit) control signals (also referred to below as "control words") over control lines 263, 264 to each of the first and second harmonic reduction circuit portions 241, 246. As indicated in FIG. 2, each of the control lines 263, 264 may include multiple (e.g., N) control lines, which are configured to convey the bits of a multi-bit (e.g., N-bit) control signal in parallel. Alternatively, each of the control lines 263, 264 may include fewer control lines, and thus may be configured to convey a serial control signal (e.g., an N-bit control word) to each of the first and second harmonic reduction circuit portions 241, 246.

Either way, and according to an embodiment, each of the N bits in a control word corresponds to a desired state of a different one of the N capacitance legs in one of the first or second harmonic reduction circuit portions 241, 246. The value of each bit (e.g., 0 or 1) indicates whether the switching element 251-258 in the corresponding capacitance leg is "open" (i.e., in a high impedance state) or "closed" (i.e., in a low impedance state). When a switching element 251-258 is open, the capacitor 242-245, 247-250 in that capacitance leg does not contribute to the total capacitance value of the first or second harmonic reduction circuit portions 241, 246. In other words, that capacitor 242-245, 247-250 is not connected between the respective input 251, 252 and the ground reference node 280. Conversely, when a switching element 251-258 is closed, the capacitor 242-245, 247-250 in that capacitance leg does contribute to the total capacitance value of the first or second harmonic reduction circuit portions 241, 246. In other words, that capacitor 242-245, 247-250 is connected between the respective input 251, 252 and the ground reference node 280. For example purposes, a bit value of 0 corresponds to an open (i.e., high impedance) state for a switching element 251-258, and a bit value of 1 corresponds to a closed (i.e., low impedance) state for a switching element 251-258. Those of skill in the art would understand, based on the description herein, that a bit value of 0 alternatively may correspond to a closed state and a bit value of 1 alternatively may correspond to an open state, in an alternate embodiment.

The above-described embodiment indicates that a binary code is used to encode switching state information. In other embodiments, other coding techniques alternatively could be used (e.g., temperature coding, or other suitable techniques). Accordingly, the inventive subject matter is not limited by any particular coding technique used to encode switching state information.

The first and second harmonic reduction circuit portions 241, 246 are configurable into any of a number, M, of "tuning states" for the harmonic reduction circuit 240 (e.g., tuning states 1-16, FIG. 6), where $M=2^N$. Accordingly, in an embodiment in with N=4, the number of tuning states, M, equals 16. Each tuning state of the first or second harmonic reduction circuit portion 241, 246 corresponds with a combination of capacitors 242-245, 247-250 that are (and are not) connected between the respective input 251, 252 and the ground reference node 280. According to an embodiment, each tuning state corresponds with a different capacitance value for the first or second harmonic reduction circuit portion 241, 246. Accordingly, the first and second harmonic reduction circuit portions 241, 246 may alternatively be referred to as "configurable shunt capacitance circuits."

The total capacitance value of each of the first or second harmonic reduction circuit portions 241, 246 at any given time equals the sum of the capacitance values of the capacitors 242-245 or 247-250 that are connected between the respective input 251, 252 and the ground reference node 280. Each of the M tuning states corresponds to a different combination of capacitance values. In order to achieve M unique capacitance values using N capacitance legs, the values of each capacitor 242-245, 247-250 are different in each of the first and second harmonic reduction circuit portions 241, 246. According to a specific embodiment, each of the smallest capacitors (e.g., capacitors 242 and 247) have a lowest (nominal) capacitance value, C, and the other capacitors have increasingly larger values. For example, according to an embodiment, each of the capacitance values increase by a factor of 2 from the smallest capacitors (e.g., capacitors 242 and 247) to the largest capacitors (e.g., capacitors 245 and 247). In other words:

- the capacitance value of capacitors 245 and 247 equals $2^0 \times C$ (i.e., C);
- the capacitance value of capacitors 246 and 248 equals $2^1 \times C$ (i.e., 2×C);
- the capacitance value of capacitors 246 and 248 equals $2^2 \times C$ (i.e., 4×C); and
- the capacitance value of capacitors 246 and 248 equals $2^3 \times C$ (i.e., 8×C). According to an embodiment, the lowest capacitance value, C, is in a range of about 100 femtofarads to about 2.0 picofarads, although the lowest capacitance value may be lower or higher, as well.

By providing appropriate control words over control lines 263, 264, the tuning controller 268 may configure each of the first and second harmonic reduction circuit portions 241, 246 to have a desired capacitance value. Assuming a 4-bit control word, for example, where the least significant bit corresponds to the first (and lowest value) capacitor in each of the first and second harmonic reduction circuit portions 241, 246, and each higher bit corresponds to the next (and next higher valued) capacitor, a control word of 0001 results in a capacitance value of C, and a control word of 1111 results in a capacitance value of 15×C.

As will be described below in conjunction with FIGS. 4-6, prior to normal operations, a calibration process (e.g., process 400, FIG. 4) is performed to determine a tuning state for which a duty cycle of a signal produced at the differential output of amplifier 210 is closest to a 50 percent duty cycle. This tuning state is referred to herein as a "calibrated tuning state." According to an embodiment, when the differential output of amplifier 210 is closest to a 50 percent duty cycle (i.e., when the harmonic reduction circuit 240 is configured in the calibrated tuning state), the harmonic reduction circuit 240 is configured to reduce or substantially eliminate second harmonic energy resulting from offsets due to mismatches in the circuit, as discussed previously (i.e., the harmonic reduction circuit 240 is configured to reduce second harmonic energy to a maximal extent). Accordingly, the goal of the calibration process is to identify the calibrated tuning state as the tuning state at which the differential output of amplifier 210 is closest to a 50 percent duty cycle.

Briefly, to perform the calibration process (e.g., process 400, FIG. 4), the tuning controller 268 of the calibration and tuning subsystem 260 controls the input signal generator 230 to produce a calibration signal (e.g., a CW signal). The tuning controller 268 also configures the harmonic reduction circuit 240, as described above, by setting the capacitance values of each of the first and second harmonic reduction circuit portions 241, 246 to various combinations of values (e.g., capacitance values specified in table 600, FIG. 6), and the calibration and tuning subsystem 260 measures the duty cycle of signals produced at the differential output 212 of the amplifier 210. This process is repeated multiple times to determine multiple duty cycles for multiple different configurations of the harmonic reduction circuit 240.

Various circuitry and methods may be employed to determine the duty cycle of the signal produced at the differential output 212 of amplifier 210, and one non-limiting example is depicted in FIG. 2 and described next. More specifically, according to an embodiment, in order to enable measurement of the duty cycle of a signal produced at the differential output 212 of amplifier 210, the calibration and tuning subsystem 260 includes a differential signal clipper circuit 261 ("clipper circuit"), a duty cycle measurement circuit 262, and the tuning controller 268.

The clipper circuit 261 has a differential input, which is coupled across the differential output 212 of the amplifier 210. More specifically, a first terminal of the differential input to the clipper circuit 261 is coupled to differential output terminal 213 (and to path 216 and balun input 223), and a second terminal of the differential input to the clipper circuit 261 is coupled to differential output terminal 214 (and to path 217 and balun input 224).

According to an embodiment, the clipper circuit 261 is configured to convert a sinusoidal differential signal (e.g., an amplified calibration signal) provided at the differential output 212 roughly into a square wave signal. Any of a number of different types of clipper circuits may be employed for this purpose, and the selected type of clipper circuit may depend on the semiconductor technology used (e.g., CMOS, silicon on insulator (SoI), silicon germanium (SiGe), and so on). Either way, clipper circuit 300 includes a differential input 302, a differential output 304, and a clipper circuit coupled between the input 302 and output 304. In operation, a differential sinusoidal input signal 310 is provided across the differential input 302, and the clipper circuit clips the input signal 310 at maximum positive and negative voltages. More specifically, the clipper circuit functions to limit the maximum voltage of the input signal 310 in the positive and negative directions, resulting in a clipped output signal 320 that roughly resembles a square wave.

Figure 3:
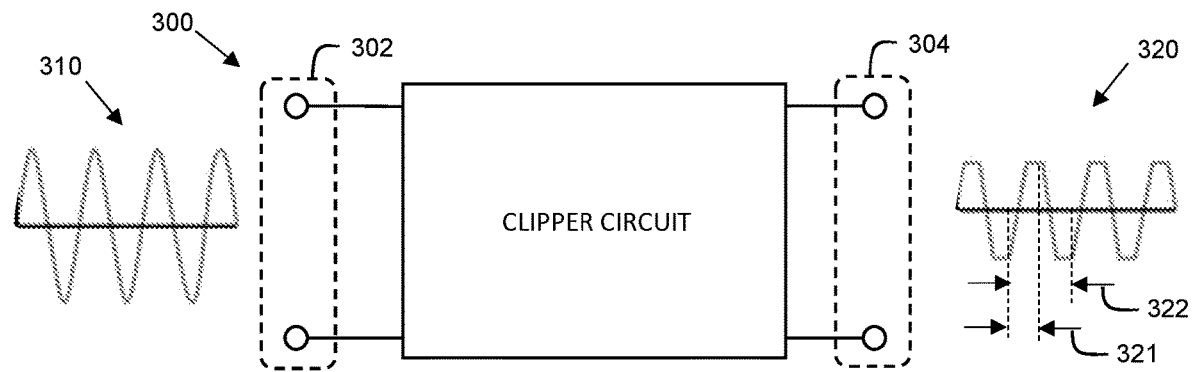
FIG. 3 is an example of a clipper circuit that may be used in the circuits of FIGS. 1 and/or 2, according to an embodiment.

Referring also to FIG. 2, in whichever manner the clipped output signal (e.g., signal 320) is produced, duty cycle measurement circuit 262 is configured to measure (or estimate) the duty cycle of the clipped output signal produced by the clipping circuit 300. More specifically, the duty cycle measurement circuit 262 is configured to detect rising and/or falling edges of the clipped output signal, and to determine the ratio between a first duration of time (e.g., duration 321, FIG. 3) between a first rising edge of the signal and a next falling edge, and a second duration of time (e.g., duration 322, FIG. 3) corresponding to the period of the signal. During a calibration process, as described below, the duty cycle measurement circuit 262 provides the measured duty cycle to the tuning controller 268, which may store the measured duty cycle in memory 270.

Figure 4:
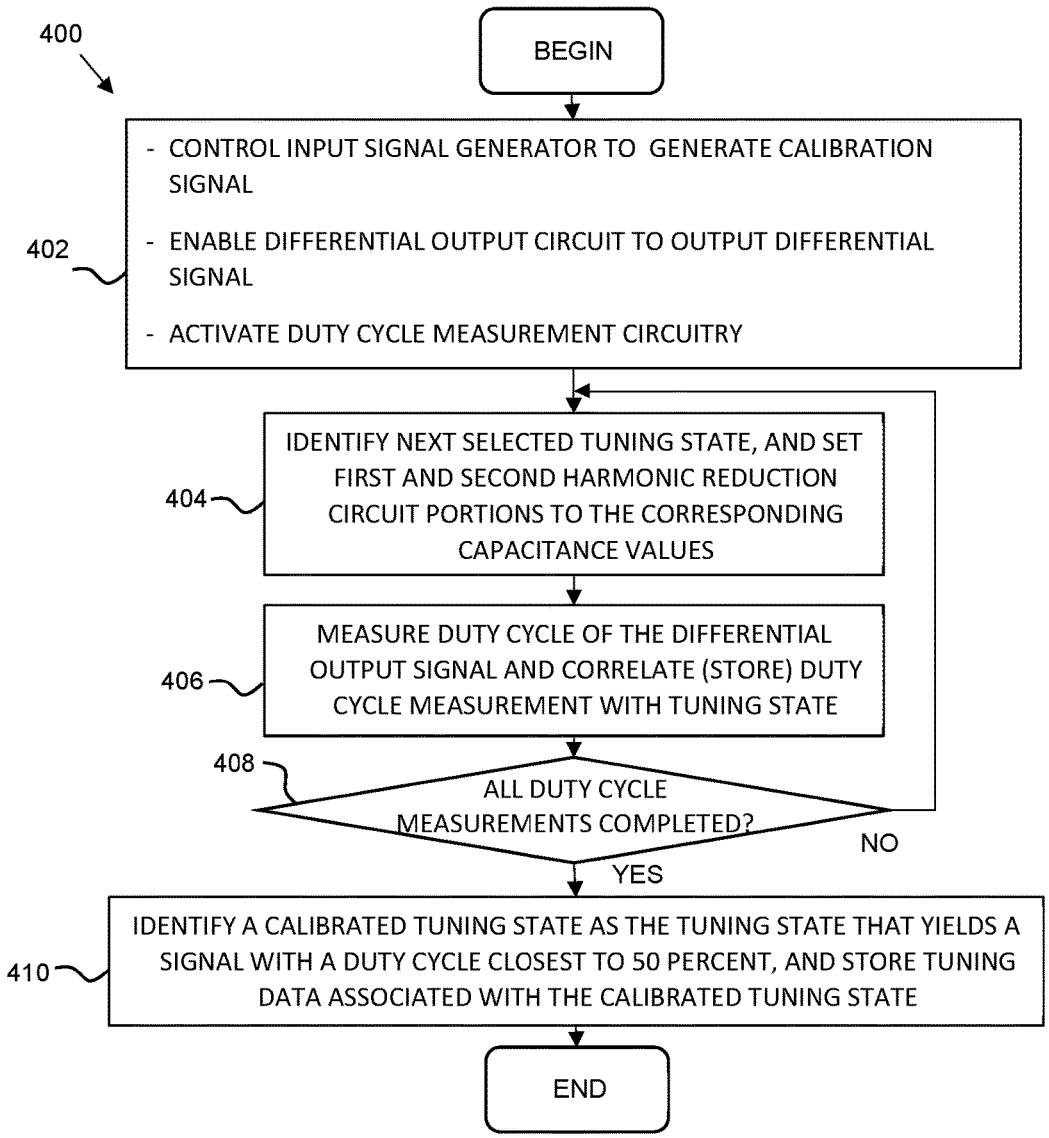
FIG. 4 is a flowchart of a process for calibrating a harmonic reduction circuit, according to an embodiment.

FIG. 4 is a flowchart of a process 400 for calibrating a harmonic reduction circuit (e.g., circuits 140, 240, FIGS. 1, 2), according to an embodiment. For enhanced understanding, FIG. 4 should be viewed in conjunction with FIGS. 5 and 6, where FIG. 5 is a chart 500 illustrating relative capacitance values for a plurality of tuning states of a configurable harmonic reduction circuit, and FIG. 6 is a table 600 that lists relative capacitance values for a plurality of tuning states of a configurable harmonic reduction circuit, along with duty cycle measurements, according to an embodiment.

The calibration method begins, in step 402, by configuring the electronic system (e.g., system 100 or transmitter 200, FIGS. 1, 2) to perform the calibration process. According to an embodiment, this includes providing, by the tuning controller (e.g., tuning controller 168, 268, FIGS. 1, 2) a control signal to the input signal generator (e.g., signal generator 130, 230, FIG. 1, 2), which causes the input signal generator to produce a single-ended or differential configuration signal as an input to the differential output circuit (e.g., circuit 110 or amplifier 210, FIGS. 1, 2). For example, the calibration signal may be a sinusoidal signal, such as a continuous wave (CW) signal.

In addition, in step 402, the tuning controller may enable the differential output circuit to output a differential signal at its differential output (e.g., output 112, 212, FIGS. 1, 2). For example, this enables amplifier 210 (FIG. 2) to amplify the calibration signal in order to produce an amplified calibration signal at output 212 (FIG. 2). The tuning controller also activates (or enables) the duty cycle measurement circuitry (e.g., circuitry 162, 261, 262, FIGS. 1, 2), which may thereafter perform duty cycle measurements of the altered calibration signal that is produced at the differential output (e.g., output 112, 212, FIGS. 1, 2).

Next, an iterative process (including blocks 404, 406, 408) is performed by the tuning controller to measure duty cycles associated with a plurality of tuning states. More specifically, in block 404, the tuning controller identifies a next selected tuning state for which a duty cycle measurement will be taken. According to an embodiment, the tuning controller may access information stored in memory (e.g., memory 170, 270, FIGS. 1, 2) to identify next tuning states and control signals associated with those tuning states.

Figures 5, 6:
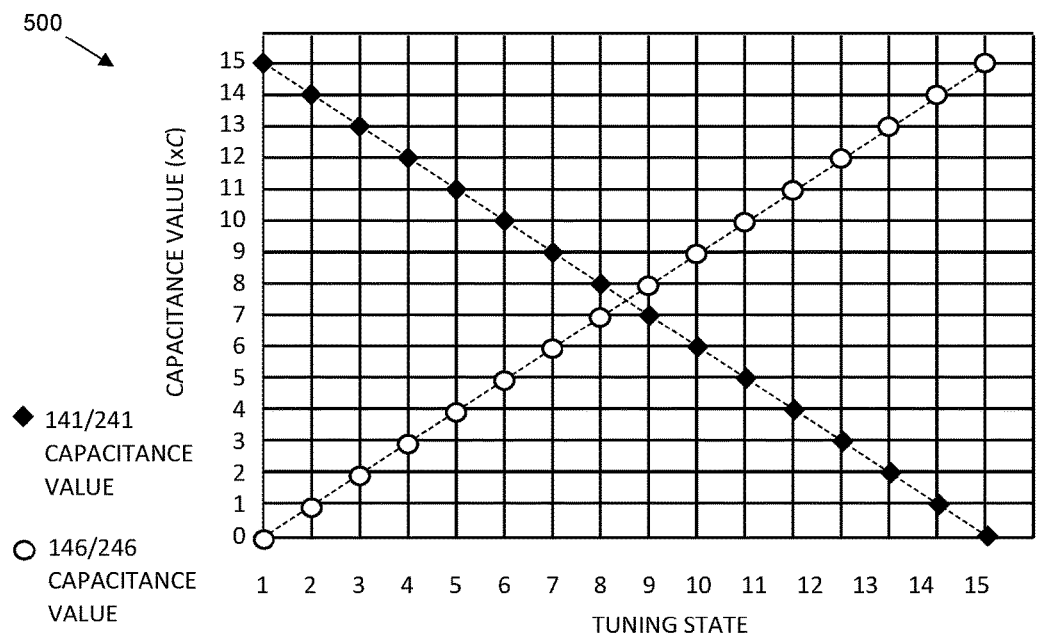
FIG. 5 is a chart illustrating relative capacitance values for a plurality of tuning states of a configurable harmonic reduction circuit, according to an embodiment.
FIG. 6 is a table that lists relative capacitance values for a plurality of tuning states of a configurable harmonic reduction circuit, along with duty cycle measurements, according to an embodiment.

For example, and referring now to FIG. 6, a tuning state table 600, which is stored in memory, may be pre-populated to include information associated with a plurality of tuning states. More particularly, table 600 includes tuning data that is used during the calibration process. As used herein, "tuning data" means digital information that may be used to control states of the first and second harmonic reduction circuit portions 241, 246 so that the first and second harmonic reduction circuit portions 241, 246 have specified capacitance values between the inputs of the first and second harmonic reduction circuit portions 241, 246 and the ground reference node 280. Further, as used herein, a "tuning state" is a configuration of the harmonic reduction circuit that is associated with a unique combination of a first capacitance for the first harmonic reduction circuit portion 241 and a second capacitance for the second harmonic reduction circuit portion 246. As used herein, a "tuning state table" is a table (e.g., stored in memory) that includes a plurality of records, where each record indicates a different combination of capacitance values for the first and second harmonic reduction circuit portions 241, 246.

For each tuning state, a data structure (or record) may include a plurality of fields, including a tuning state identifier (column 602), a first control word (column 606) corresponding to a first capacitance value (optional column 604) for the first harmonic reduction circuit portion (e.g., circuit portion 141, 241, FIGS. 1, 2), and a second control word (column 610) corresponding to a second capacitance value (optional column 608) for the second harmonic reduction circuit portion (e.g., circuit portion 146, 246, FIGS. 1, 2). For example, in table 600, a first record 621 corresponding to tuning state 1 (column 602) includes a first control word (column 606) of "1111" for the first harmonic reduction circuit portion, and a second control word (column 610) of "0000" for the second harmonic reduction circuit portion. Although it is not essential to indicate the corresponding capacitance values, for convenience these values are indicated in columns 604 and 608 to correspond to capacitance values of 15×C for the first harmonic reduction circuit portion and 0×C for the second harmonic reduction circuit portion.

According to an embodiment, and referring to also FIG. 5, the table 600 is configured so that, for any given tuning state, the control words are pre-populated so that the capacitance values for the first and second harmonic reduction circuit portions 241, 246 will have an asymmetrical (i.e., unequal) relationship for most or all of the tuning states. In addition, the table 600 is configured so that the capacitance values for the first and second harmonic reduction circuit portions 241, 246 change in value in an inverse manner through the various tuning states. In other words, as one proceeds from tuning state 1 (record 621) to tuning state 16 (record 636), the first control words (column 606) correspond to capacitance values that start at a maximum value (e.g., 15×C for tuning state 1) and decrease to a minimal value (e.g., 0×C for tuning state 16), whereas the second control words (column 610) correspond to capacitance values that start at a minimal value (0×C for tuning state 1) and increase to a maximum value (15×C for tuning state 16). For example, when the capacitance value for the first harmonic reduction circuit portion (e.g., portion 141, 241, FIGS. 1, 2), indicated with black diamonds in chart 500, is set to a relatively high value, the capacitance value for the second harmonic reduction circuit portion (e.g., portion 146, 246, FIGS. 1, 2), indicated with white circles in chart 500, is set to a relatively low value, and vice versa.

It may be noted that, toward the center of the chart 500 (e.g., at tuning states 8 and 9), the capacitance values of the first and second harmonic reduction circuit portions may be nearly equal. However, in some embodiments, no tuning state will indicate equal capacitance values in table 600. Accordingly, in such embodiments, the first and second harmonic reduction circuit portions 241, 246 cannot be configured to the same capacitance value, and the capacitances of the first and second harmonic reduction circuits are asymmetrical (i.e., unequal). In other embodiments, at least one of the tuning states may specify equal capacitance values for the first and second harmonic reduction circuits. Accordingly, in such embodiments, although most of the tuning states result in asymmetrical (i.e., unequal) capacitance values for the first and second harmonic reduction circuits 241, 246, at least one tuning state may result in symmetrical (i.e., equal) capacitance values for the first and second harmonic reduction circuits.

Referring again to FIG. 6, in some embodiments, the tuning state selected for the first iteration of block 404 may correspond to the first record 621 in the table 600, and subsequently selected next tuning states for subsequent iterations of block 404 may correspond to each next record in the sequence of records in the table 600 (e.g., the tuning state selected for the second iteration of block 404 may correspond to the second record 622 in the table 600, and so on until the last record 636 is selected for the last iteration of block 404). In other embodiments, the tuning state selected for the first iteration of block 404 may correspond to some other record besides the first record 621 in the table 600, and/or the subsequent iterations of block 404 may or may not select every record in the table 600 (e.g., the selection of a record for each iteration of block 404 may or may not proceed in a sequential (linear) manner through the table 600).

Once a next tuning state is selected, the tuning controller provides a first control signal to the first harmonic reduction circuit portion 241 corresponding to the first control word (column 606) in the corresponding record, and the tuning controller provides a second control signal to the second harmonic reduction circuit portion 246 corresponding to the second control word (column 610) in the corresponding record. According to an embodiment, the tuning controller configures the harmonic reduction circuit (e.g., circuit 140, 240, FIGS. 1, 2) by providing parallel or serial control signals to the first and second harmonic reduction circuit portions (e.g., portions 141, 146, 241, 246, FIGS. 1, 2). In response to receipt of the control signals, the first and second harmonic reduction circuit portions establish capacitance values corresponding to the capacitance values indicated in the control signals.

According to an embodiment, each bit in each control word corresponds to one of the plurality of switching elements in either the first or second harmonic reduction circuit portions 241, 246. For example, the least significant bit (rightmost bit) may correspond to a first switching element having a first capacitance value (e.g., element 242 or 247 with capacitance value=C), the next most significant bit (second from right) may correspond to a second switching element having a second capacitance value (e.g., element 243 or 248 with capacitance value 2×C), the next most significant bit (third from right) may correspond to a third switching element having a third capacitance value (e.g., element 244 or 249 with capacitance value 4×C) in record 622, and the most significant bit (leftmost) may correspond to a fourth switching element having a fourth capacitance value (e.g., element 245 or 250 with capacitance value 8×C).

The value of each bit in any given control word indicates whether the corresponding switching element should be placed in a low impedance state or a high impedance state. For example, a bit value of "0" may correspond to a high impedance state (switch is open) and a bit value of "1" may correspond to a low impedance state (switch is closed). Accordingly, during an iteration of block 404 in which tuning state 622 is being evaluated, the first control word (column 606) has a value of "1110", and the second control word (column 610) has a value of "0001". When the first control word ("1110") is used to control the states of switches 251-254, switch 251 would be placed in a high impedance state, and switches 252-254 would be placed in a low impedance state. Accordingly, capacitor 242 would not be coupled between the input 251 of the first harmonic reduction circuit portion 241 and the ground reference node 280, and capacitors 243-245 would be coupled between the input 251 and the ground reference node 280. Assuming that capacitors 243-245 have the values of C, 2×C, 4×C, and 8×C, respectively, the total capacitance of the first harmonic reduction circuit portion 241 would equal the sum of the capacitance values for capacitors 243-245, which is equal to 2×C+4×C+8×C=14×C. Similarly, assuming that capacitors 247-250 have the values of C, 2×C, 4×C, and 8×C, respectively, the total capacitance of the second harmonic reduction circuit portion 241 would equal the capacitance value for capacitor 247 only, which is equal to C.

Once the tuning controller has set the tuning states for the first and second harmonic reduction circuit portions 241, 246, then in block 406, the duty cycle measurement circuitry (e.g., circuitry 162 or 261, 262, FIGS. 1, 2) measures the duty cycle of the differential output signal (i.e., the signal output at differential output 112, 212, FIGS. 1, 2). As discussed previously, for example, the duty cycle may be measured by converting the differential output signal into a square wave (e.g., utilizing clipper circuit 261, FIG. 2), and the duty cycle of the square wave may then be measured (e.g., utilizing duty cycle measurement circuit 262, FIG. 2). According to an embodiment, the tuning controller then stores the measured duty cycle for that tuning state. For purposes of explanation, stored duty cycle measurements for each tuning state are shown in column 612 of FIG. 6. In actuality, the duty cycle measurements would likely be stored in a separate data construct from the tuning state table.

After measuring and storing the duty cycle for a selected tuning state, then in block 408, a determination is made whether all desired duty cycle measurements have been completed. For example, in an embodiment in which all records in the table 600 are evaluated in a sequential manner, starting from the first record 621 and ending with the last record 636, it may be determined that all desired duty cycle measurements have been completed when a duty cycle has been measured for the last record 636. In such an embodiment, the iterative loop corresponding to blocks 404, 406, 408 is performed for all records in the table 600. This embodiment essentially corresponds to a linear search. In other embodiments, only a subset of the records may be selected and evaluated in conjunction with blocks 404, 406, 408, and/or the records may be selected in a non-sequential manner. For example, in some embodiments, a binary search methodology may be employed, which selects a middle record (e.g., record 627) to be used during the first iteration of blocks 404, 406, 408, and during subsequent iterations, the next evaluated record may be above or below the initially selected record. The binary search may proceed until the search zeros in on a record which, after evaluation, yields a duty cycle that is closest to 50 percent. Other suitable record selection methods may be utilized as well.

Either way, when a determination is made, in block 408, that all desired duty cycle measurements have not been completed, then the process returns to block 404 for another iteration. However, when a determination is made, in block 408, that all desired duty cycle measurements have been completed, the process proceeds to block 410.

In block 410, a "calibrated tuning state" is identified. According to an embodiment, the calibrated tuning state is identified as the tuning state that has resulted in a differential output signal (at the differential output 112, 212, FIGS. 1, 2) with a duty cycle that is closest to 50 percent. For example, referring to the hypothetical duty cycle measurements listed in column 612 of table 600, tuning state 13 (column 602) resulted in a duty cycle of 50.1 percent, which is the closest value to 50 percent. Accordingly, tuning state 13 would be identified as the calibrated tuning state. Given that the record for tuning state 13 indicates that the first control word is "0011", the calibrated tuning state corresponds to the first harmonic reduction circuit portion 241 having switches 242 and 243 in a high impedance state, and switches 244 and 245 in a low impedance state, as shown in FIG. 2. Accordingly, only capacitors 244 and 245 contribute to the total capacitance of the first harmonic reduction circuit portion 241. In addition, the record for tuning state 13 indicates that the second control word is "1100". Accordingly, the calibrated tuning state corresponds to the second harmonic reduction circuit portion 246 having switches 257 and 258 in a high impedance state, and switches 255 and 256 in a low impedance state, as shown in FIG. 2. Accordingly, only capacitors 247 and 248 contribute to the total capacitance of the second harmonic reduction circuit portion 246.

According to an embodiment, once the calibrated tuning state is identified in block 410, control information corresponding to the calibrated tuning state is stored in memory for subsequent use during normal operation. For example, the control information stored for the calibrated tuning state may include the first and second control words for the calibrated tuning state. After storing the control information for the calibrated tuning state, the calibration method ends.

Figure 7:
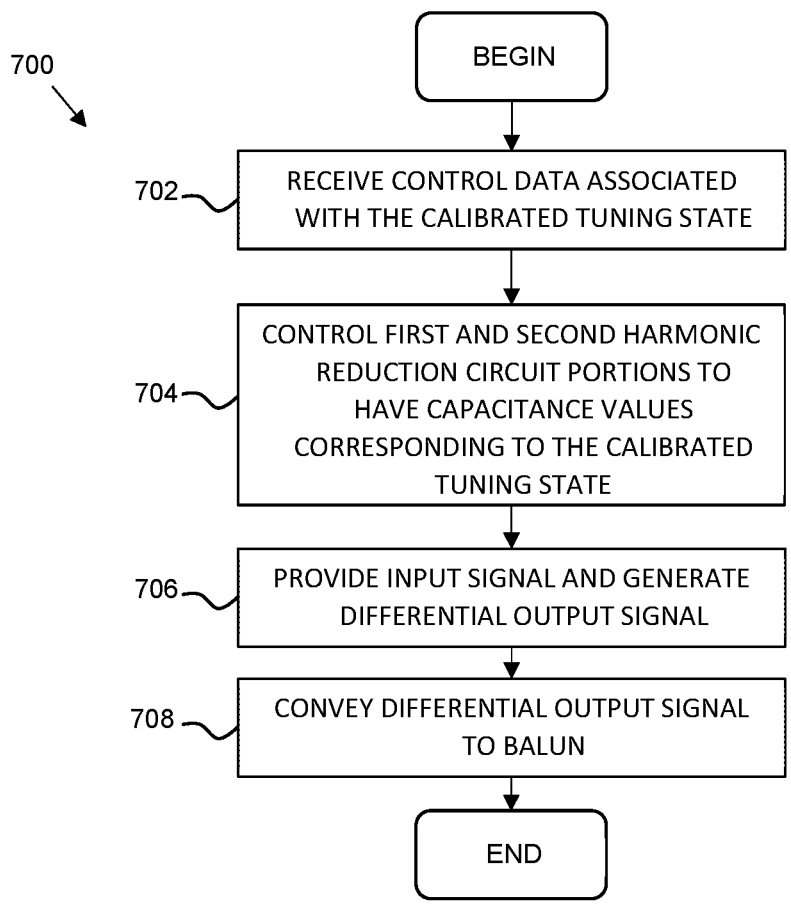
FIG. 7 is a flowchart of a process for configuring a harmonic reduction circuit to a desired tuning state, according to an embodiment.

FIG. 7 is a flowchart of a process 700 for configuring a harmonic reduction circuit (e.g., circuit 140, 240, FIGS. 1, 2) to a desired tuning state prior to normal operations, according to an embodiment. As used herein, "normal operations" refers to operation of a system (e.g., electronic system 100 or transmitter 200, FIGS. 1, 2) when the input signal generator (e.g., signal generator 130, 230, FIGS. 1, 2) provides an information-bearing input signal to the differential output circuit (e.g., circuit 110 or amplifier 210, FIGS. 1, 2).

The method may begin, in block 702, when the tuning controller (e.g., tuning controller 168, 268, FIGS. 1, 2) retrieves, from memory (e.g., memory 170, 270, FIGS. 1, 2) the control information (or tuning data) associated with setting the capacitance values for the calibrated tuning state (e.g., the control information stored in block 410, FIG. 4).

In block 704, the tuning controller then configures the harmonic reduction circuit (e.g., circuit 140, 240, FIGS. 1, 2) by sending control signals to the first and second harmonic reduction circuit portions (e.g., portions 141, 146, 241, 246, FIGS. 1, 2), which cause the shunt capacitance values of the first and second harmonic reduction circuit portions to correspond to the combination of values associated with the calibrated tuning state. As described previously in conjunction with block 404 of FIG. 4, sending the control signals may include sending control words to the first and second harmonic reduction circuit portions, which have values that correspond to the capacitance values for the first and second harmonic reduction circuit portions.

In block 706, the input signal generator (e.g., signal generator 130, 230, FIGS. 1, 2) is then activated to provide an input signal (e.g., an information-bearing input signal) to the input of the differential output circuit (e.g., circuit 110 or amplifier 210, FIGS. 1, 2). In response, the differential output circuit generates a differential output signal, which is conveyed to the balun (e.g., balun 120, 220, FIGS. 1, 2) in block 708. Normal operation of the system then proceeds with the calibrated tuning state of the harmonic reduction circuit having been established.

An embodiment of a transmitter includes an amplifier with a differential output, a balun, a configurable harmonic reduction circuit, and a control circuit. The differential output of the amplifier includes first and second differential output terminals, and the amplifier is configured to amplify an input signal and to produce a differential output signal at the differential output during operation of the amplifier. The balun has a primary winding and a secondary winding. The primary winding has a first balun terminal coupled to the first differential output terminal, and a second balun terminal coupled to the second differential output terminal. The configurable harmonic reduction circuit includes a first configurable shunt capacitance circuit coupled between the first differential output terminal and a ground reference node, and a second configurable shunt capacitance circuit coupled between the second differential output terminal and the ground reference node. The control circuit is configured to receive tuning data associated with a calibrated tuning state. The tuning data indicates a first calibrated capacitance value for the first configurable shunt capacitance circuit and a second calibrated capacitance value for the second configurable shunt capacitance circuit. The control circuit is further configured to control the first configurable shunt capacitance circuit to have the first calibrated capacitance value, and to control the second configurable shunt capacitance circuit to have the second calibrated capacitance value. According to a further embodiment, the first calibrated capacitance value and the second calibrated capacitance value are unequal.

An embodiment of an electronic circuit includes a differential output circuit, a balun, a configurable harmonic reduction circuit, and a control circuit. The differential output circuit includes a differential output, which includes first and second differential output terminals. The differential output circuit is configured to produce a differential output signal at the differential output during operation of the electronic circuit. The balun has a primary winding and a secondary winding. The primary winding has a first balun terminal coupled to the first differential output terminal, and a second balun terminal coupled to the second differential output terminal. The configurable harmonic reduction circuit includes a first configurable shunt capacitance circuit coupled between the first differential output terminal and a ground reference node, and a second configurable shunt capacitance circuit coupled between the second differential output terminal and the ground reference node. The control circuit is configured to receive tuning data associated with a calibrated tuning state. The tuning data indicates a first calibrated capacitance value for the first configurable shunt capacitance circuit and a second calibrated capacitance value for the second configurable shunt capacitance circuit. The control circuit is further configured to control the first configurable shunt capacitance circuit to have the first calibrated capacitance value, and to control the second configurable shunt capacitance circuit to have the second calibrated capacitance value. According to a further embodiment, the first calibrated capacitance value and the second calibrated capacitance value are unequal.

An embodiment of a method of operating an electronic circuit that includes a differential output circuit with a differential output, and a balun with a primary coil coupled across the differential output includes the step of receiving, by a control circuit, tuning data associated with a calibrated tuning state. The tuning data indicates a first calibrated capacitance value for a first configurable shunt capacitance circuit and a second calibrated capacitance value for a second configurable shunt capacitance circuit. The first configurable shunt capacitance circuit is coupled to a first differential output terminal of the differential output, and the second configurable shunt capacitance circuit is coupled to a second differential output terminal of the differential output. The method further includes the steps of controlling, by the control circuit, the first configurable shunt capacitance circuit to have the first calibrated capacitance value, and controlling, by the control circuit, the second configurable shunt capacitance circuit to have the second calibrated capacitance value. The method further includes the steps of providing an input signal to the differential output circuit, resulting in the generation of a differential output signal at the differential output, and conveying the differential output signal to the primary coil of the balun.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed description matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A transmitter comprising:
   an amplifier with a differential output, wherein the differential output includes first and second differential output terminals, and wherein the amplifier is configured to amplify an input signal and to produce a differential output signal at the differential output during operation of the amplifier;
   a balun with a primary winding and a secondary winding, wherein the primary winding has a first balun terminal coupled to the first differential output terminal, and a second balun terminal coupled to the second differential output terminal;
   a configurable harmonic reduction circuit that includes
      a first configurable shunt capacitance circuit coupled between the first differential output terminal and a ground reference node, and
      a second configurable shunt capacitance circuit coupled between the second differential output terminal and the ground reference node;
   memory configured to store, for each of a plurality of tuning states, tuning data indicating a combination of first and second capacitance values for the first and second configurable shunt capacitance circuits, respectively, wherein the combination of capacitance values for at least some of the plurality of tuning states indicates that the first and second capacitance values are different from each other; and
   a control circuit configured to receive, from the memory, the tuning data associated with a calibrated tuning state selected from the plurality of tuning states, wherein the tuning data indicates a first calibrated capacitance value for the first configurable shunt capacitance circuit and a second calibrated capacitance value for the second configurable shunt capacitance circuit, and wherein the control circuit is further configured to control the first configurable shunt capacitance circuit to have the first calibrated capacitance value, and to control the second configurable shunt capacitance circuit to have the second calibrated capacitance value.

2. The transmitter of claim 1, wherein the amplifier is selected from a group consisting of a linear power amplifier and a switching power amplifier.

3. The transmitter of claim 1, wherein:
   in the tuning data in the memory, the first capacitance value and the second capacitance value change in value in an inverse manner through the plurality of tuning states.

4. The transmitter of claim 1, wherein:
   the first configurable shunt capacitance circuit has a number, M, of states, and wherein each state of the first configurable shunt capacitance circuit corresponds with a different capacitance value for the first configurable shunt capacitance circuit; and
   the second configurable shunt capacitance circuit has the number, M, of states, and wherein each state of the second configurable shunt capacitance circuit corresponds with a different capacitance value for the second configurable shunt capacitance circuit.

5. The transmitter of claim 1, further comprising:
   a first conductive path with a first end coupled to the first differential output terminal, and a second end coupled to the first balun terminal, wherein the first configurable shunt capacitance circuit is connected to the first conductive path; and
a second conductive path with a first end coupled to the second differential output terminal, and a second end coupled to the second balun terminal, wherein the second configurable shunt capacitance circuit is connected to the second conductive path.

6. A transmitter comprising:
an amplifier with a differential output, wherein the differential output includes first and second differential output terminals, and wherein the amplifier is configured to amplify an input signal and to produce a differential output signal at the differential output during operation of the amplifier;
a balun with a primary winding and a secondary winding, wherein the primary winding has a first balun terminal coupled to the first differential output terminal, and a second balun terminal coupled to the second differential output terminal;
a configurable harmonic reduction circuit that includes
  a first configurable shunt capacitance circuit coupled between the first differential output terminal and a ground reference node, and
  a second configurable shunt capacitance circuit coupled between the second differential output terminal and the ground reference node;
a control circuit configured to receive tuning data associated with a calibrated tuning state, wherein the tuning data indicates a first calibrated capacitance value for the first configurable shunt capacitance circuit and a second calibrated capacitance value for the second configurable shunt capacitance circuit, and wherein the control circuit is further configured to control the first configurable shunt capacitance circuit to have the first calibrated capacitance value, and to control the second configurable shunt capacitance circuit to have the second calibrated capacitance value; and
a calibration circuit coupled to the differential output, wherein the calibration circuit is configured to
  generate a duty cycle measurement of the differential output signal for a plurality of tuning states, and
  identify the calibrated tuning state as one of the plurality of tuning states for which the duty cycle measurement is closest to 50 percent.

7. The transmitter of claim 6, wherein the calibration circuit comprises:
a clipper circuit coupled to the differential output, and configured to convert the differential output signal into a square wave signal; and
a duty cycle detection circuit coupled to the clipper circuit, and configured to generate the duty cycle measurement by measuring the duty cycle of the square wave signal.

8. The transmitter of claim 6, wherein the differential output circuit, the balun, the configurable harmonic reduction circuit, the control circuit, the calibration circuit, and memory all are integrally formed within a single semiconductor chip.

9. A transmitter comprising:
an amplifier with a differential output, wherein the differential output includes first and second differential output terminals, and wherein the amplifier is configured to amplify an input signal and to produce a differential output signal at the differential output during operation of the amplifier;
a balun with a primary winding and a secondary winding, wherein the primary winding has a first balun terminal coupled to the first differential output terminal, and a second balun terminal coupled to the second differential output terminal;
a configurable harmonic reduction circuit that includes
  a first configurable shunt capacitance circuit coupled between the first differential output terminal and a ground reference node, and
  a second configurable shunt capacitance circuit coupled between the second differential output terminal and the ground reference node; and
a control circuit configured to receive tuning data associated with a calibrated tuning state, wherein the tuning data indicates a first calibrated capacitance value for the first configurable shunt capacitance circuit and a second calibrated capacitance value for the second configurable shunt capacitance circuit, and wherein the control circuit is further configured to control the first configurable shunt capacitance circuit to have the first calibrated capacitance value, and to control the second configurable shunt capacitance circuit to have the second calibrated capacitance value, and
wherein the first configurable shunt capacitance circuit includes a first input coupled to the first differential output terminal, and a number, N, of first capacitance legs coupled between the first input and the ground reference node, wherein each of the first capacitance legs includes a capacitor coupled in series with a switching element, and wherein the control circuit is configured to control the first configurable shunt capacitance circuit to have the first calibrated capacitance value by controlling the switching element in each of the first capacitance legs to connect or disconnect, from the first configurable shunt capacitance circuit, the capacitor in each of the first capacitance legs, and
the second configurable shunt capacitance circuit includes a second input coupled to the second differential output terminal, and the number, N, of second capacitance legs coupled between the second input and the ground reference node, wherein each of the second capacitance legs includes a capacitor coupled in series with a switching element, and wherein the control circuit is configured to control the second configurable shunt capacitance circuit to have the second calibrated capacitance value by controlling the switching element in each of the second capacitance legs to connect or disconnect, from the second configurable shunt capacitance circuit, the capacitor in each of the second capacitance legs.

10. The transmitter of claim 9, wherein, in each of the first and second capacitance legs, the switching element is a component selected from a group consisting of a transistor and a mechanical switch.

11. An electronic circuit comprising:
a differential output circuit that includes a differential output, wherein the differential output includes first and second differential output terminals, and wherein the differential output circuit is configured to produce a differential output signal at the differential output during operation of the electronic circuit;
a balun with a primary winding and a secondary winding, wherein the primary winding has a first balun terminal coupled to the first differential output terminal, and a second balun terminal coupled to the second differential output terminal;

a configurable harmonic reduction circuit that includes
    a first configurable shunt capacitance circuit coupled between the first differential output terminal and a ground reference node, and
    a second configurable shunt capacitance circuit coupled between the second differential output terminal and the ground reference node;
memory configured to store, for each of a plurality of tuning states, tuning data indicating a combination of first and second capacitance values for the first and second configurable shunt capacitance circuits, respectively, wherein the combination of capacitance values for at least some of the plurality of tuning states indicates that the first and second capacitance values are different from each other; and
a control circuit configured to receive, from the memory, the tuning data associated with a calibrated tuning state selected from the plurality of tuning states, wherein the tuning data indicates a first calibrated capacitance value for the first configurable shunt capacitance circuit and a second calibrated capacitance value for the second configurable shunt capacitance circuit, and wherein the control circuit is further configured to control the first configurable shunt capacitance circuit to have the first calibrated capacitance value, and to control the second configurable shunt capacitance circuit to have the second calibrated capacitance value.

12. The electronic circuit of claim 11, wherein:
in the tuning data in the memory, the first capacitance value and the second capacitance value change in value in an inverse manner through the plurality of tuning states.

13. The electronic circuit of claim 11, wherein:
the differential output circuit is a circuit selected from a group consisting of a linear power amplifier and a switching power amplifier.

14. The electronic circuit of claim 11, further comprising:
a calibration circuit coupled to the differential output, wherein the calibration circuit is configured to
    generate a duty cycle measurement of the differential output signal for the plurality of tuning states, and
    identify the calibrated tuning state as one of the plurality of tuning states for which the duty cycle measurement is closest to 50 percent.

15. The electronic circuit of claim 11, wherein:
the first configurable shunt capacitance circuit includes a first input coupled to the first differential output terminal, and a number, N, of first capacitance legs coupled between the first input and the ground reference node, wherein each of the first capacitance legs includes a capacitor coupled in series with a switching element, and wherein the control circuit is configured to control the first configurable shunt capacitance circuit to have the first calibrated capacitance value by controlling the switching element in each of the first capacitance legs to connect or disconnect, from the first configurable shunt capacitance circuit, the capacitor in each of the first capacitance legs; and
the second configurable shunt capacitance circuit includes a second input coupled to the second differential output terminal, and the number, N, of second capacitance legs coupled between the second input and the ground reference node, wherein each of the second capacitance legs includes a capacitor coupled in series with a switching element, and wherein the control circuit is configured to control the second configurable shunt capacitance circuit to have the second calibrated capacitance value by controlling the switching element in each of the second capacitance legs to connect or disconnect, from the second configurable shunt capacitance circuit, the capacitor in each of the second capacitance legs.

16. A method of operating an electronic circuit that includes a differential output circuit with a differential output, and a balun with a primary coil coupled across the differential output, the method comprising:
storing, in a memory, tuning data for each of a plurality of tuning states, wherein the tuning data indicates a combination of first and second capacitance values for first and second configurable shunt capacitance circuits, respectively, and wherein the combination of capacitance values for at least some of the plurality of tuning states indicates that the first and second capacitance values are different from each other;
receiving, by a control circuit from the memory, the tuning data associated with a calibrated tuning state selected from the plurality of tuning states, wherein the tuning data indicates a first calibrated capacitance value for the first configurable shunt capacitance circuit and a second calibrated capacitance value for the second configurable shunt capacitance circuit, wherein the first configurable shunt capacitance circuit is coupled to a first differential output terminal of the differential output, and the second configurable shunt capacitance circuit is coupled to a second differential output terminal of the differential output;
controlling, by the control circuit, the first configurable shunt capacitance circuit to have the first calibrated capacitance value;
controlling, by the control circuit, the second configurable shunt capacitance circuit to have the second calibrated capacitance value;
providing an input signal to the differential output circuit, resulting in generation of a differential output signal at the differential output; and
conveying the differential output signal to the primary coil of the balun.

17. The method of claim 16, wherein:
in the tuning data in the memory, the first capacitance value and the second capacitance value change in value in an inverse manner through the plurality of tuning states.

18. The method of claim 16, further comprising:
performing a calibration process by a calibration circuit coupled to the differential output, wherein performing the calibration process includes
    generating a duty cycle measurement of the differential output signal for the plurality of tuning states, and
    identifying the calibrated tuning state as one of the plurality of tuning states for which the duty cycle measurement is closest to 50 percent.

* * * * *